United States Patent
Simonneaux et al.

(10) Patent No.: US 9,436,901 B2
(45) Date of Patent: Sep. 6, 2016

(54) METHOD OF INCORPORATING AN ELEMENT IN A DATA CARRIER

(75) Inventors: Grégory Simonneaux, Nanterre (FR); Loïc Le Garrec, Nanterre (FR)

(73) Assignee: OBERTHUR TECHNOLOGIES, Levallois Perret (FR)

( * ) Notice: Subject to any disclaimer, the term of this patent is extended or adjusted under 35 U.S.C. 154(b) by 374 days.

(21) Appl. No.: 13/612,206

(22) Filed: Sep. 12, 2012

(65) Prior Publication Data
US 2013/0074320 A1    Mar. 28, 2013

(30) Foreign Application Priority Data
Sep. 22, 2011  (EP) .................................. 11306198

(51) Int. Cl.
| H01S 4/00 | (2006.01) |
| G06K 19/077 | (2006.01) |
| H05K 13/04 | (2006.01) |
| H01G 7/02 | (2006.01) |

(52) U.S. Cl.
CPC ... G06K 19/07747 (2013.01); G06K 19/07771 (2013.01); H01G 7/023 (2013.01); H05K 13/0413 (2013.01); Y10T 29/49002 (2015.01); Y10T 29/53261 (2015.01)

(58) Field of Classification Search
CPC ............... G06K 19/07747; G06K 19/07771; Y10T 29/49002; Y10T 29/53261
USPC ...... 29/592.1, 601, 600, 740, 832, 843, 854; 235/492
See application file for complete search history.

(56) References Cited

U.S. PATENT DOCUMENTS

| 7,623,034 B2* | 11/2009 | Ferguson et al. .......... 340/572.1 |
| 2002/0053735 A1* | 5/2002 | Neuhaus ................ H05K 3/325 257/728 |
| 2007/0171619 A1 | 7/2007 | Akita et al. |
| 2008/0000077 A1* | 1/2008 | Van Gastel .......... H05K 13/021 29/729 |
| 2011/0117838 A1* | 5/2011 | Bosquet ........... G06K 19/07739 455/41.1 |

FOREIGN PATENT DOCUMENTS

| WO | WO 2008/065278 A2 | 6/2008 |
| WO | WO 2009/107279 A1 | 9/2009 |

* cited by examiner

*Primary Examiner* — Peter DungBa Vo
*Assistant Examiner* — Azm Parvez
(74) *Attorney, Agent, or Firm* — Arent Fox LLP

(57) ABSTRACT

A method of placing an element onto a data carrier, where there is a placement actuator arranged to be able to secure the element. A transport layer is advanced until the element is located between the placement actuator and the data carrier in a desired position. The actuator is moved towards the data carrier so that it secures the element. The transport layer is then retracted to detach the element from it and then the placement element is moved towards the data carrier to bring the element into contact with the data carrier at the desired position.

13 Claims, 3 Drawing Sheets

METHOD OF INCORPORATING AN ELEMENT IN A DATA CARRIER

CROSS-REFERENCED TO RELATED APPLICATION

This Application claims priority to European Patent Application No. 11306198.0, filed Sep. 22, 2011, the disclosure of which is hereby incorporated in its entirety by reference.

FIELD OF THE INVENTION

The current invention relates to a method of incorporating an element in a data carrier and a data carrier manufactured using that method. In particular but not exclusively the invention relates to the positioning of an element, such as a shielding layer in a smart card.

BACKGROUND OF THE INVENTION

Smart cards are devices having electronic elements in them such as electronic tags. By electronic tag is meant an assembly including a support, a communication circuit, such as a near-field communication circuit including an electronic chip and a near-field communication antenna, allowing contactless communication to be established with an external device for exchanging data. The antenna is generally connected to the electronic chip and is used not only as a means of contactless communication, but also to produce the energy needed for power supply to the chip.

In order to ensure optimal transmission of data between the tag and the external device, regardless of the tag's metallic environment, the tag is provided with a magnetic shielding layer that is capable of protecting the communication circuit. The protection of the circuit is important especially in a "contactless payment" application carried on a mobile telephone because the mobile telephone includes a battery and occasionally even a metal case which can interfere greatly with the quality of data transmission to an external reader when the tag is fixed to the mobile communication device.

A contactless type tag suited for application in a metallic environment is already known in the state of the art, in particular from document WO2008/065278. In this document, the tag includes an intermediate layer made of a magnetically hyper-conductive material, placed against a substrate bearing the antenna and the microcircuit. The assembly made up of the substrate, the antenna and the microcircuit is later embedded in a cover made of plastic by lamination or molding.

A disadvantage with known tags is that there is a need for accurate placement of the shielding layer so that it aligns with the communication circuit. Any misalignment means that there can be a reduction in the shielding, which with a contactless payment system could mean that the transaction could be compromised. Currently shielding is put in place by picking and placing the shielding material in a set location on a smart card. To do this requires accurate alignment of all components in the manufacturing process with little or no tolerances, which can be very difficult to achieve.

The present invention seeks to overcome the problems with the prior art by providing a method for accurately and easily positioning of a magnetic shield, which results in an improved smart card which is less likely to suffer from problems of interference when being used in a transaction. Furthermore, the flexibility of the method allows for the positioning of shielding material at a range of different locations on a smart card to the ease of positioning of the layer.

SUMMARY OF THE INVENTION

According to a first embodiment of the invention there is provided a method of placing an element onto a data carrier the method comprising;
 providing a placement actuator arranged to secure the element and locate the data carrier in a known position relative to the placement actuator;
 providing a transport layer having the element detachable therefrom;
 advancing the transport layer until the element is located between the placement actuator and the data carrier in a desired position;
 displacing the placement actuator towards the data carrier until the actuator secures the element;
 retracting the transport layer, whereby the element is detached from the transport layer; and
 further displacing the placement element towards the data carrier to bring the element into contact with the data carrier at the desired position.

Preferably the element is a shielding element or an electronic module. In the case of an electronic module the module is a chip having a microcircuit such as the type incorporated in electronic cards, such as credit cards.

It is envisaged that the data carrier is a smart card.

It is preferred that the actuator is linearly displaced towards the data carrier and substantially at right angles to the movement of the transport layer.

Preferably the element is adhered to the transport layer on a first face.

It is envisaged that the element is substantially rigid in format.

It is preferred that the element comprises a ferrite element.

Preferably the data carrier is a card body or a card element that is detachable from a card body.

It is envisaged that the data carrier includes a recess arranged to receive the element therein and the known position of the shielding element when the transport layer is advanced corresponds to the position of the recess.

Preferably the recess has a shape substantially matching the shape of the element, such as a shielding element or module.

In a preferred arrangement the transport layer is removably provided on the element and the method further comprises retracting a tool that supports the transport layer when the element is held by the actuator so that the transport layer is detached from the first face of the element.

It is envisaged that the tool is moved in a direction that is substantially perpendicular to, e.g. at right angles to the direction of movement of the actuator.

Preferably the a protective layer is removably provided on the element on a second face of the element opposite to the first face and which can be removed from the element after placement of the element on the data carrier.

In a second embodiment there is provided a system for producing a data carrier having an element incorporated thereon, said system including a placement actuator, a feed for a transport layer and a feed for a data carrier, wherein;
 the placement actuator is arranged to secure the element and locate the data carrier in a known position relative to the placement actuator;
 there is provided a transport layer having the element detachable therefrom;

the transport layer is advanced until the element is located between the placement actuator and the data carrier in a desired position; the placement actuator is displaced towards the data carrier until the actuator secures the element;

the transport layer is retracted whereby the element is detached from the transport layer; and the placement element is further displaced towards the data carrier to bring the element into contact with the data carrier at the desired position. Again, the element can be a shielding element or an electronic module such as a chip to be included in a smart card.

Preferably the system includes a tool that is used to advance an element towards the actuator and when the actuator has secured the element the tool is arranged to return to a position aligned with a next element on transport layer.

BRIEF DESCRIPTION OF THE FIGURES

An embodiment of the invention will now be described by way of example only with reference to the accompanying figures in which.

DETAILED DESCRIPTION OF EMBODIMENTS OF THE INVENTION

Figure 1:
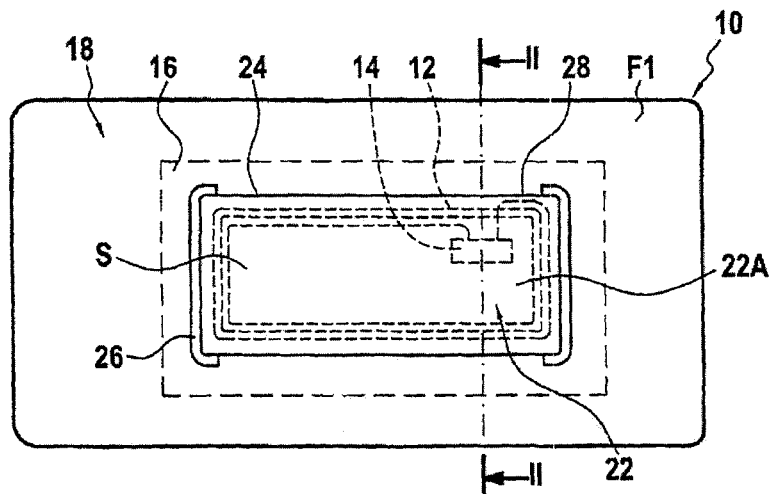
FIG. 1 shows: a plan view of data carrier with the circuitry typically contained in such a carrier.

The present invention is particularly useful in the manufacture of data carriers that are to be used with mobile phones, such as SIM cards. SIM cards have circuitry which needs to be protected from interference during data transmission. The invention is described with reference to shielding elements but is could be used in the incorporation of other modules that are transported on transport layers such as electronic modules that are inserted in data cards such as credit cards. The invention will from now on be described with reference to a shielding element though. The shielding is often by using a material such as ferrite which in itself can be quite fragile because if it is bent, there is damage to the material and so it is often provided on a support structure such as a tape when being handled. Furthermore the ferrite often has a protective cover such as a liner which further prevents damage during handling. FIG. 1 shows a typical data carrier 10 which includes a near-field communication antenna 12 and a microcircuit 14 connected to antenna 12 shown by transparency (in dotted lines in FIG. 1). Microcircuit 14 and antenna 12 together constitute near-field communication means able to communicate with external equipment such as a specialized reader. As an example, the near-field communication means of device 10 and the reader are able to communicate in compliance with the ISO 14443 communication protocol. The antenna 12 is made up for example of a plurality of electrically conductive loops and defines a usable magnetic field receiving area S. By usable area S it is meant, the area of antenna 12 which, when a magnetic field passes through it, an induction current is produced.

In addition, device 10 includes a magnetic shielding layer 16 arranged so as to extend at least partially under area S of antenna 12. Such a layer 16 makes in possible in particular to reduce the magnetic perturbations generated by a metallic environment located close to electronic device 10. Layer 16 is made for example of an electrically insulating and magnetically permeable material, such as ferrite. The thickness of the layer lies for example between 200 and 300 microns and its relative permeability is around 100. Preferably, layer 16 has dimensions larger than antenna area S and is arranged in device 10 so as to cover it over its entire area S.

One of the difficulties in handling shielding materials such as ferrite, known methods for inserting such materials in data carriers concentrate on the precise alignment of the data carrier and the shielding material. The shielding material is held on a support which linearly displaces and inserts the shielding material at a particular location on the data carrier—this is known as a "pick and place" system. The tolerances in such a system are minimal so there has to be precise alignment for the shielding material to be placed where needed. The support for, for example, a ferrite coating means that there must be a placement accuracy of +/−1 mm on the X and Y axis. The main problem with such requirements is the fact that we are cumulating tolerances in having to align the ferrite and the data carrier. Furthermore, with known pick and place systems there is the difficulty that when a support for the ferrite is used in the form of a cup or gripper, contact is with the ferrite protecting layer and not the ferrite itself, which means that the two can become detached. The use of the protective layer also contributes to an increase in the accuracy of placement of the shielding material and again there is the need to synchronise the positioning of the various components in the system.

Figure 2:
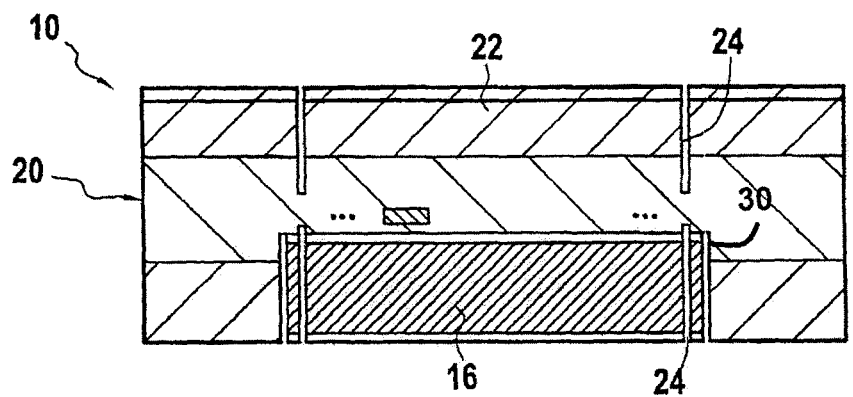
FIG. 2 shows: a side view of a data carrier having an element, which is shown in the figure as a shielding layer.

FIG. 2 shows the position of a protective material such as ferrite in a data carrier. There is a predefined part of the card which is to incorporate the antenna and the microcircuit. Typically there is a cavity is arranged so that it extends at least partially into the predefined part under the usable area of the antenna, the cavity being sized to completely accommodate the shielding layer. Card body 20 is made of a plastic such as PVC or even PC (polycarbonate). This card body 20 is preferably made by laminating layers of plastic together.

It is preferred that body 20 includes a middle layer 20A called an "inlay," incorporating antenna 12 and microcircuit 14, interposed between two layers called lower layer 20B and upper layer 20C and colloquially called the "core layer," and finally a protective layer 20D arranged on the upper layer 20C and being generally made of a plastic that is transparent to visible light.

Typically, card body 20 delimits outside dimensions that comply with a standardized microcircuit card format, for example the ID-1 format of the ISO 7816 standard.

More particularly, body 20 includes a cavity 30, opening onto a face of body 20, which extends at least partially under antenna area S. This cavity 30 is sized so as to fully accommodate shielding layer 16. Preferably, shielding layer 16 is flush with the surface of card body 20. In the example described, shielding layer 16 is attached by gluing to the inside of cavity 30 using an adhesive layer 32.

Often body 20 includes a detachable plate 22 within which are arranged antenna 12 and microcircuit 14, and within which extends at least partially the shielding layer 16 lodged in cavity 30. This detachable plate 22 constitutes a contactless electronic tag. For example, plate 22 is delimited by a breakable line 24 built into body 20 and provided to allow the separation of plate 22 and body 20 by manual pressure alone along this line 24, for line 24 includes through incisions 26 or partial depth incisions 28 (see FIG. 1). Through incisions 26 are made along the short side edges and partial depth incisions 28 are made along the long side edges of the rectangular plate as shown in FIG. 1.

Figure 3:
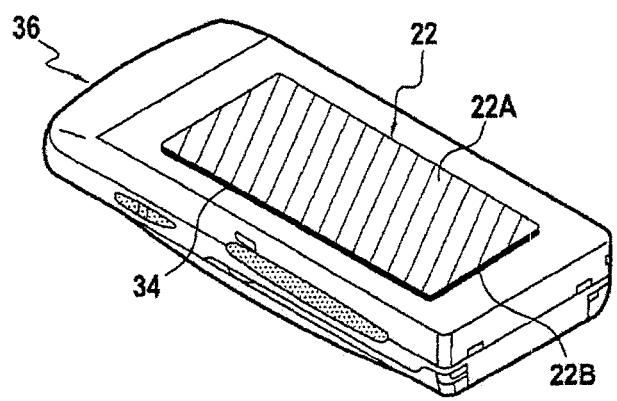
FIG. 3 shows: a mobile device having a data carrier with an element, which in this case is a shielding layer attached to said device.

As shown in FIG. 3, plate 22 has a substantially rectangular overall shape. Preferably, cavity 30 and shielding layer 16 extend at least through the entire plate 22, extending for example beyond both sides of the perimeter of plate 22. Shielding layer 16 includes on a face intended to be oriented toward the outside of cavity 30, a second adhesive coating 34 to allow detachable plate 22 to be attached to the surface of a piece of equipment external to device 10, flush with the surface of body 20. Preferably, this adhesive coating 34 is provided with a removable, non-adhesive foil to facilitate the handling of device 10 and avoid the accumulation of dust or particles on the coating 34. As shown in FIG. 3, detachable plate 22 incorporates a contactless electronic payment function and is intended to be attached by gluing to a mobile telephone terminal 36. However the plate may be used with a whole range of communication devices, such a mobile computers or laptops. The plate constitutes a contactless electronic tag having a reading face 22A from which data can be exchanged between the near-field communication means and an external reader, and a shielding face 22B able to limit all interference that might be generated by an object to which the tag 22 is attached.

Figure 4:
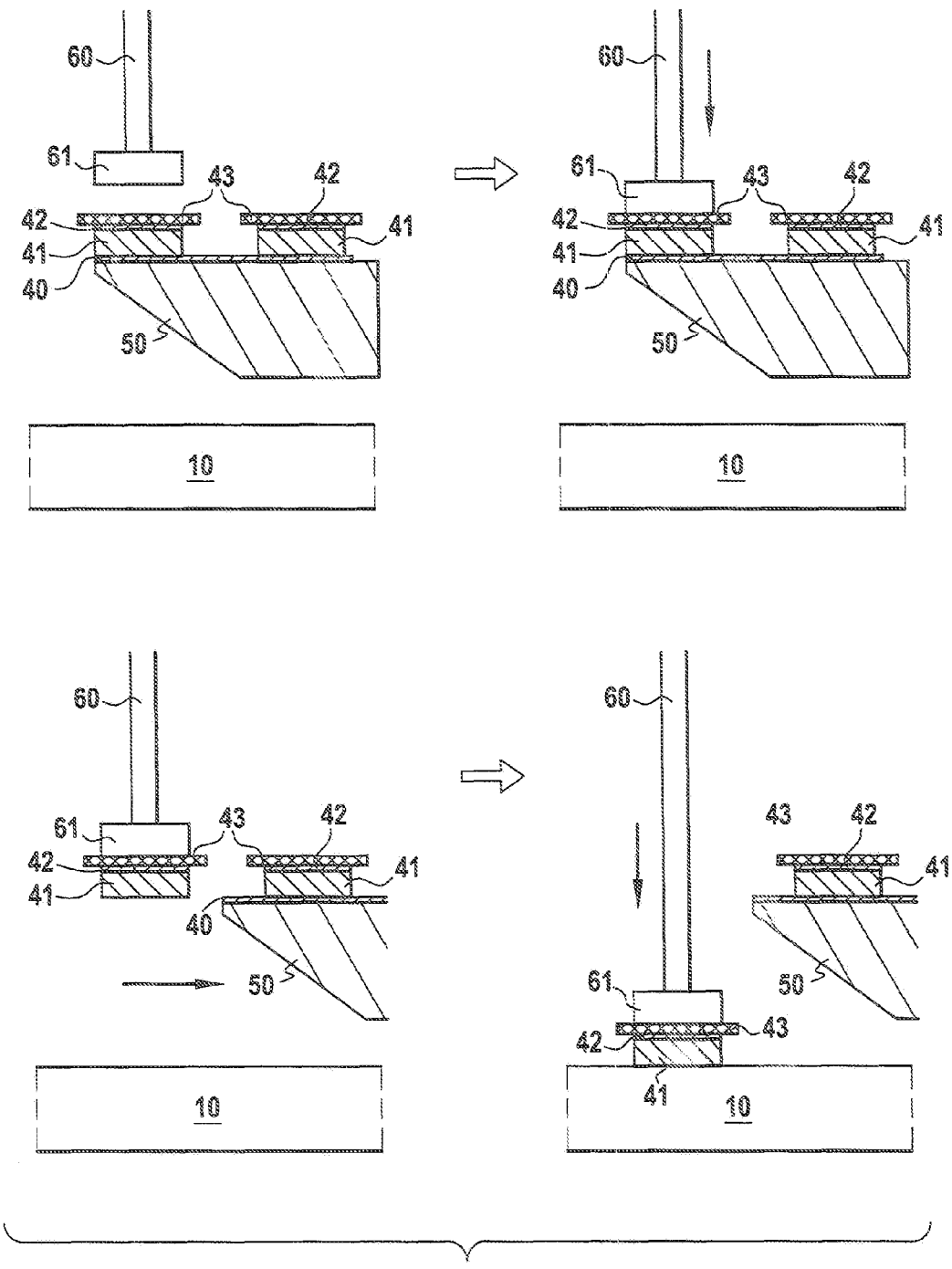
FIG. 4 shows: the apparatus used in the method of incorporating an element, such as a shielding layer in accordance with an embodiment of the invention.

As shown in FIG. 4, the method of affixing a layer that substantially prevents interference with communication on a data carrier is by a novel method that involves peeling and placing the layer in position on a data carrier. The process can be considered as having 4 main stages, marked 1 to 4 in the figure. The process can be used for a data carrier which is used as a whole, for example data carrier 10 as shown in FIG. 1 (without a detachable plate 22). It can also be used with a card that includes a detachable plate 22 as shown in FIG. 2.

Stage 1 of FIG. 4 shows a transport layer 40 which acts as a carrier for layers such as ferrite that are used to avoid interference in communication devices. The carrier is supported by feed tool 50. Ferrite is referred to as an illustrative example of the material used to avoid interference but other materials can be used that can provide a magnetic shielding layer. The ferrite is shown as layer 41 which is attached on one face to the transport layer 40 by an adhesive. The other face of the ferrite layer also has adhesive 42 which is preferably a releasable adhesive which is secured to protective layer 43 that reduces the risk of scratching of, or dust accumulating on the ferrite layer. This protective or backing layer also contributes to the protection of the relatively fragile ferrite layer 41 during handling. The whole arrangement of 40, 41, 42 and 43 equates to ferrite layer 16 shown in previous figures. The transport layer 40 is typically a tape on which the element 16 is supported or integrated and from which the element can be removed.

As shown in stage 2, the actuator moves in a substantially vertical direction to attach to the protective layer 43. In Stage 3, the ferrite is detached from the carrier 40 and the tool 50 that carries the transport layer retracts. This leaves space for the actuator 60 to move in a downwards direction as shown in stage 4 so that the ferrite is placed in a data carrier, such as a card 10. As can be seen, the transport layer 40 is moved by the tool, and as a result, the ferrite is offered up to the actuator so it can come into position above the ferrite and then it can move down towards the ferrite pick it up and the transport layer 40 retracts away from a "picking zone" once the ferrite has been picked up by the actuator head 61 so that there is room for the actuator to move downwards to place the ferrite in position. As the transport layer is retracted, the ferrite releases as the adhesive bond between the ferrite and the transport layer is broken.

The actuator 60 has head 61, which typically is a suction device that can pick up the ferrite with minimal force being applied so that there is minimal risk of damage to the ferrite layer. The head 61 is arranged to place the ferrite into the cavity in a data carrier. The tolerances are typically +/−0.5 mm it is possible to meet tolerances of +/−0.25 mm which is much better than known systems. The present invention allows for tight control of the alignment of the picking up of the ferrite and placing in position in a card as shown in 4, this is further facilitated by controlling and coordinating the speed of the movement of a delivery device which offers up cards 10 to the position below the actuator 60 and which withdraws the transport/carrier layer 40 that feeds ferrite to the operation. Furthermore there is accuracy in positioning the ferrite in the data carrier because of the fact that there are less moving parts than known processes. The precise coordination of advancing the transport/carrier layer 40 combined with the movement of the actuator in a movement substantially perpendicular to the carrier advance means that tolerances can be reduced for positioning of the ferrite in a data carrier. There is no need for a separate removal of the protective layer as this is incorporated in the picking up and positioning process for the ferrite. The fact that there is a minimizing of steps also means that rigid and fragile materials can be handled with the minimal risk of damage.

Figure 5:
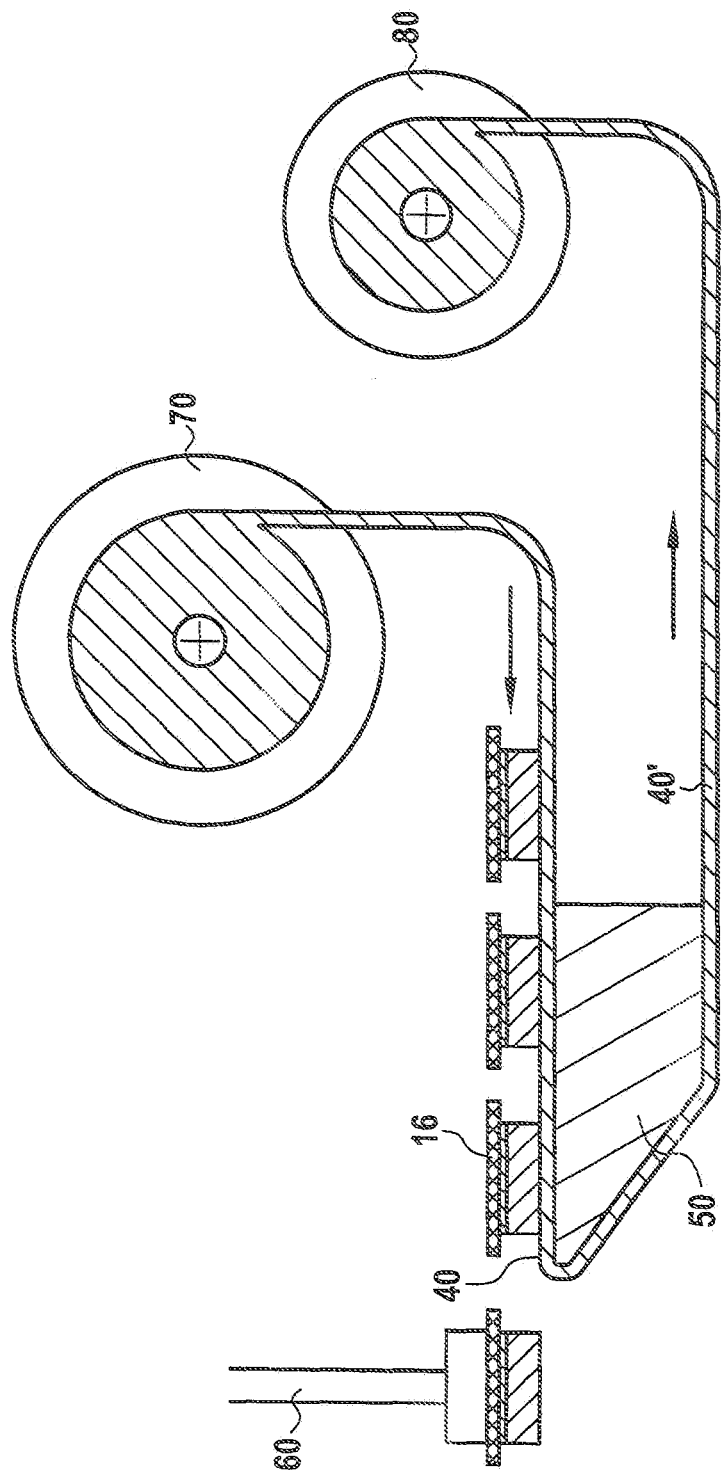
FIG. 5 shows apparatus used to feed elements to be secured to a data carrier according to an embodiment of the invention.

As shown in FIG. 5, the transport layer 40 is fed using a pulley 70 which allows the transport layer to be brought towards tool 50 which interacts with tool 50. The tool 50 moves to the left so that it is placed under actuator 60 and once the actuator moves element 16 (shielding element or module) towards a data carrier e.g. a smarty card then the empty transport layer 40' is pulled by second pulley 80 so that a second element 16 can be brought forward and rest above tool 50 which is then moved towards actuator 60 and one the actuator has secured or gripped the element 16, the tool moves back to pick up the next element on the transport layer. The actuator may grip the element or it may use a suction cup to secure the element or a combination of gripping and suction.

Although the invention has been described with reference to the incorporation of a shielding layer, the method may also be used to incorporate a module such as an electronic nodule in a data carrier such as a smart card. The invention has particular applications in the incorporation of elements that may be damaged during handling and which need to be placed accurately in position in or on a data carrier such as a smart card.

It is to be understood that the above embodiments have been provided only by way of exemplification of this invention, such as those detailed below, and that further modifications and improvements thereto, as would be apparent to persons skilled in the relevant art, are deemed to fall within the broad scope and ambit of the present invention described. Furthermore where individual embodiments are discussed, the invention is intended to cover combinations of those embodiments as well.

The invention claimed is:
1. A method of placing an element onto a data carrier, the method comprising:

providing a placement actuator arranged to secure the element and locate the data carrier in a known position relative to the placement actuator;

providing a transport layer having the element detachable therefrom;

advancing the transport layer until the element is located between the placement actuator and the data carrier in a desired position;

displacing the placement actuator towards the data carrier until the actuator secures the element;

retracting the transport layer after the placement actuator secures the element, so that the element is detached from the transport layer and space is provided for the placement actuator to move towards the data carrier; and displacing the placement actuator towards the data carrier to bring the element into contact with the data carrier at the desired position.

2. The method according to claim 1, wherein the element is a shielding element or an electronic module.

3. The method according to claim 1, wherein the data carrier is a smart card.

4. The method according to claim 1, wherein the actuator is linearly displaced towards the data carrier and at right angles to the movement of the transport layer.

5. The method according to claim 1, wherein the element is adhered to the transport layer on a first face of said element.

6. The method according to claim 1, wherein the element is rigid in format.

7. The method according to claim 1, wherein the element comprises a ferrite element.

8. The method according to claim 1, wherein the data carrier is a card body or a plate that is detachable from the card body, the plate being a part of the card body.

9. The method according to claim 1, wherein the data carrier includes a recess arranged to receive the element therein and the known position of the element when the transport layer is advanced corresponds to the position of the recess.

10. The method according to claim 9, wherein the recess has a shape similar to the shape of the element.

11. The method according to claim 1, wherein the transport layer is removably provided on the element and the method further comprises a retracting tool that supports the transport layer when the element is held by the actuator so that the transport layer is detached from the first face of the element.

12. The method according to claim 11, wherein the tool is moved in a direction that is at right angles to the direction of movement of the actuator.

13. The method according to claim 1, wherein a protective layer is removably provided on the element on a second face of the element opposite to the first face and which can be removed from the element after placement of the element on the data carrier.

* * * * *